US005877874A

United States Patent [19]
Rosenberg

[11] Patent Number: 5,877,874
[45] Date of Patent: Mar. 2, 1999

[54] DEVICE FOR CONCENTRATING OPTICAL RADIATION

[75] Inventor: Glenn A. Rosenberg, Tucson, Ariz.

[73] Assignee: TerraSun L.L.C., Tucson, Ariz.

[21] Appl. No.: 897,068

[22] Filed: Jul. 18, 1997

Related U.S. Application Data

[63] Continuation-in-part of Ser. No. 518,760, Aug. 24, 1995, abandoned.

[51] Int. Cl.$^6$ .................................................. G02B 5/32
[52] U.S. Cl. ............................... 359/15; 359/10; 359/24; 359/28; 359/34; 136/246; 136/259
[58] Field of Search ................................. 359/1, 10, 15, 359/22, 24, 28, 34, 35; 136/246, 259

[56] References Cited

U.S. PATENT DOCUMENTS

| | | | |
|---|---|---|---|
| 4,012,150 | 3/1977 | Upatnieks | 356/247 |
| 4,309,070 | 1/1982 | St. Leger Searle | 350/3.7 |
| 4,412,528 | 11/1983 | Elzinga, Jr. | 126/417 |
| 4,418,238 | 11/1983 | Lidorenko et al. | 359/15 |
| 4,490,981 | 1/1985 | Meckler | 60/641.15 |
| 4,505,264 | 3/1985 | Tremblay | 126/439 |
| 4,643,515 | 2/1987 | Upatnieks | 350/3.67 |
| 4,682,841 | 7/1987 | Afian et al. | 350/3.7 |
| 4,691,994 | 9/1987 | Afian et al. | 350/320 |
| 4,711,512 | 12/1987 | Upatnieks | 350/3.7 |
| 4,863,224 | 9/1989 | Afian et al. | 350/3.7 |
| 5,039,352 | 8/1991 | Mueller et al. | 136/246 |
| 5,048,925 | 9/1991 | Gerritsen et al. | 359/569 |
| 5,151,800 | 9/1992 | Upatnieks | 359/14 |
| 5,268,985 | 12/1993 | Ando et al. | 385/129 |
| 5,517,339 | 5/1996 | Riccobono et al. | 359/15 |

OTHER PUBLICATIONS

Benton et al, "Edge–Lit Rainbow Holograms", SPIE vol. 1212 Practical Holography IV (1990), p. 154.

*Primary Examiner*—Cassandra Spyrou
*Assistant Examiner*—Darren E. Schuberg
*Attorney, Agent, or Firm*—Benman & Collins

[57] ABSTRACT

A holographic planar concentrator (HPC) for collecting and concentrating optical radiation is provided. The holographic planar concentrator comprises a planar highly transparent plate and at least one multiplexed holographic optical film mounted on a surface thereof. The multiplexed holographic optical film has recorded therein a plurality of diffractive structures having one or more regions which are angularly and spectrally multiplexed. Two or more of the regions may be configured to provide spatial multiplexing. The HPC is fabricated by: (a) recording the plurality of diffractive structures in the multiplexed holographic optical film employing angular, spectral, and, optionally, spatial multiplexing techniques; and (b) mounting the multiplexed holographic optical film on one surface of the highly transparent plate. The recording of the plurality of diffractive structures is tailored to the intended orientation of the holographic planar concentrator to solar energy. The HPC is mounted in the intended orientation for collecting solar energy and at least one solar energy-collecting device is mounted along at least one edge of the holographic planar concentrator. Examples of suitable solar energy-collecting devices include photovoltaic cells and fiber optic lightguides for transmitting collected light into an interior of a building for illumination purposes and for transmitting collected solar radiation into a hot water tank for heating. The HPC permits efficient collection of solar energy without expensive requirements, while minimizing energy losses.

44 Claims, 5 Drawing Sheets

DEVICE FOR CONCENTRATING OPTICAL RADIATION

CROSS-REFERENCE TO RELATED APPLICATION

The present application is a continuation-in-part application of Ser. No. 08/518,760, filed Aug. 24, 1995 now abandoned.

TECHNICAL FIELD

The present invention relates to optics, particularly to the field of optical concentrators for gathering optical radiation. The optical concentrator made by the subject of the present invention may be used in all technical areas where concentrated optical radiation is utilized. It can be used for optical radiation spanning the spectrum from the ultra-violet to the infrared.

BACKGROUND ART

Luminescent solar concentrators are known in the art and act to trap and collect light from luminescent centers dispersed in a planar sheet. Luminescent concentrators utilize the total internal reflection in the wave-guide to trap a portion of the light emitted from the luminescent centers. The luminescent centers reradiate longer wavelength light in a 360 degree solid angle and so are inefficient in directing light to one edge of the plate or to a small region of the edge.

One example of a solar concentrator known in the art utilizes a hologram and a prism or plate; see, e.g., U.S. Pat. No. 4,863,224, issued to Afian et al. However, this solar concentrator needs to be aligned to the sun and does not provide for any passive solar tracking ability.

Also known in the art is a light gathering device comprising a hologram and a total reflection surface for a collecting monochromatic light at a single angle of incidence; see, e.g., U.S. Pat. No. 5,268,985, issued to Ando et al. However, Ando et al employ a single angle of incidence and a single wavelength, and thus require a tracking mechanism and cannot utilized the entire solar spectrum.

Yet another concentrator known in the prior art is an electromagnetic wave concentrator; see, e.g., U.S. Pat. No. 4,505,264, issued to Tremblay. The electromagnetic wave concentrator utilizes a multidielectric guiding plate to concentrate electromagnetic energy. This invention has the disadvantage of multiple reflection losses in the guiding plate and high absorption losses in some of the more cost effective embodiments. Also this invention posses difficult optical fabrication problems and hence is more expensive to fabricate.

There remains a need for a solar concentrator that decreases energy is losses in the concentration of solar radiation and that utilizes a substantial portion of the solar spectrum while reducing or eliminating tracking requirements.

DISCLOSURE OF INVENTION

Accordingly, it is an object of the present invention to provide a spectrally selective solar concentrator in which different spectral components of sunlight can be concentrated for use as different forms of energy such as electricity, light and heat.

It is a further object of the present invention to reduce or eliminate tracking requirements for solar concentrators.

It is another object of the present invention to simplify the design and manufacture of solar concentrators.

It is a still further object of the present invention to provide a light concentrator which can have its spectral selectivity designed for the desired application. Each application disclosed herein has a unique spectral requirement to work effectively.

It is a yet further object of the present invention to provide a solar concentrator which acts as a passive filtering device for UV and IR in light gathering illumination systems.

Further objects and advantages of the present invention will become apparent from a consideration of the drawings and ensuing description thereof.

In accordance with the present invention, a holographic planar concentrator for collecting and concentrating optical radiation is provided. The holographic planar concentrator comprises a planar highly transparent plate and at least one multiplexed holographic optical film mounted on a surface thereof to form a light guiding structure. The multiplexed holographic optical film has recorded therein a plurality of diffractive structures having two or more regions which are angularly and spectrally multiplexed. The multiplexed hologram is adapted to couple optical radiation into the planar highly transparent plate such that the optical radiation is not lost and travels through both the planar highly transparent plate and the multiplexed holographic film. The multiplexing of the hologram serves to reduce recoupling losses in the holographic planar concentrator.

The highly transparent plate is multifunctional and performs in the following manner. First, it acts as a structural support for the holographic material. Second, it provides environmental protection to the holographic material. Third, it provides high optical transmission in the wavelength range of 350 to 1400 nanometers, which is important to the total efficiency of the holographic planar concentrator. Fourth, the higher refractive index of the glass relative to the air surrounding it functions to compress the incoming angular acceptance angles from a full angle of 160 degrees to approximately 80 degrees for daily sun angle variations; this reduces the angular performance requirements on the holographic structure. Fifth, the highly transparent plate acts as a total internal reflection (TIR) secondary concentrator for the holographic planar concentrator device.

The higher refractive index of the highly transparent plate relative to air provides TIR confinement in the highly transparent plate, thus limiting the divergence of the collected light to the thickness of the plate and causing an increase in concentration. The highly transparent plate thickness can also be adjusted to reduce the number of bounces that occur as the confined light propagates down the highly transparent plate by TIR. This is an important feature, since the primary limiting factor in the distance that the light can travel in the highly transparent plate is the recoupling or replay of the light by the same holographic structure. The reversability of optical systems comes into play and requires that the holographic optical elements making up the HPC have different spectral and angular performance across the surface as the light advances towards the edge of the highly transparent plate.

In addition to the spatially multiplexed holographic optical elements, recoupling losses in the HPC may be reduced by launching the optical radiation from the film into the highly transparent plate at a small trapping angle of less than about 5 degrees. As used herein, small trapping angles are measured from the plane of the holographic film and are considered to be less than 5 degrees. A combination of small trapping angles and the thickness of the highly transparent plate will further reduce the recoupling losses and allow for the HPC to be scaled to a practical size for energy collection.

Without these features to avoid recoupling, the HPC cannot be made to function effectively.

The holographic planar concentrator of the invention is fabricated by:

(a) mounting the multiplexed holographic optical film on one surface of the highly transparent plate; and (b) recording the plurality of diffractive structures in the multiplexed holographic optical film employing angular and spectral multiplexing techniques.

In the holographic planar concentrator of the invention, the recording of the plurality of diffractive structures is performed for the intended solar orientation of the holographic planar concentrator. The holographic planar concentrator is mounted in the intended orientation for collecting solar energy and at least one solar energy-collecting device is mounted along at least one edge of the holographic planar concentrator. Examples of suitable solar energy-collecting devices include photovoltaic cells and fiber optic lightguides for transmitting collected light into an interior of a building for illumination purposes and for transmitting collected solar radiation into a hot water tank for heating.

The holographic planar concentrator permits efficient collection of solar energy without expensive tracking requirements, while minimizing energy losses. The design and manufacture of the holographic planar concentrator is simple, and the resulting concentrator can be used to filter UV and IR radiation as well as disperse solar energy to a variety of solar energy-collecting devices, as described above.

In the optical communications industry, holographic coupling of light is used to move light energy into waveguides. However, the HPC needs to do much more than this with its holographic structures if it is to function properly. That is, it is essential that the holographic structure be spatially multiplexed to avoid recoupling in order for the device to work. This is completely different from the way waveguide couplers work in waveguiding applications. The holographic waveguide couplers used in the coummunications industry do not have to address subsequent passes through the holographic structure once the light is diffracted into the waveguide. Overcoming the recoupling losses in the HPC is the primary reason for the complexity of the spatial multiplexing, which embodies both the angular and spectral multiplexing in order to achieve the spatial multiplexing.

BEST MODES FOR CARRYING OUT THE INVENTION

Figure 1:
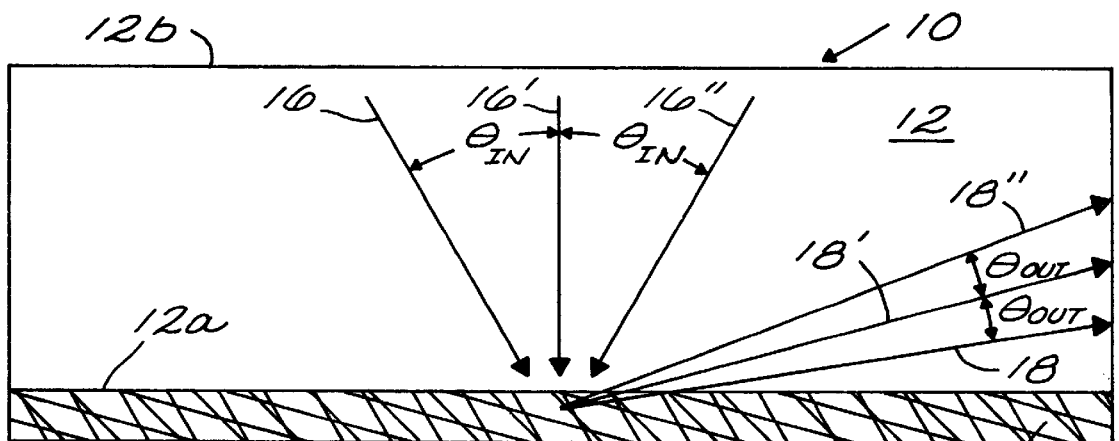
FIG. 1 is cross-sectional view of a multiplexed holographic optical structure showing angular multiplexing and steep trapping angles.

The holographic planar concentrator (HPC) of the present invention utilizes a multiplexed holographic structure (film) to diffract light into a planar highly transparent plate, such as an inorganic glass or an organic polymer, where it is confined by total internal reflection (TIR). By "highly transparent" is meant a material with an internal transmission of at least 90% per 25 mm of thickness in the 350 to 1400 nm range of the solar spectrum. This multiplexed holographic film stores a combination of angular and spectral multiplexed structures designed to collect and guide TIR light in the optical highly transparent plate. Recoupling losses from the planar highly transparent plate are reduced by forming two or more regions in the holographic film that are spatially multiplexed or by launching the light into the highly transparent plate at a small trapping angle (less than about 5 degrees) or by employing a combination of these two techniques. The volume reflection hologram is located on the opposed surface of the highly transparent plate from the incoming light.

A unique holographic fringe structure is formed by producing many fringe patterns in a single film. This is referred to as angular multiplexing and is a technique by which many recording beams pairs interfere to produce a holographic structure which will accept light from a range of input angles and output the light into a different range of angles inside a highly transparent plate of similar refractive index to the film.

In addition to angular multiplexing, spectral multiplexing using multiple wavelengths is employed. Spectral multiplexing serves to increase the spectral bandwidth of the HPC.

Spatial multiplexing may be used to prevent recoupling losses from subsequent reflections off of the multiplexed holographic optical structure (MHOS). This is achieved by fabricating a plurality of discreet regions of the MHOS with different grating vectors. Each region of the MHOS will have multiple gratings and a range of grating vectors, with regions in front of the advancing light having different diffraction characteristics than the region the light initially came from. Since the different regions have grating vector ranges that differ substantially, the light confined in the highly transparent plate is not recoupled out of the HPC when it strikes a different region of the MHOS on its way to the edge of the highly transparent plate.

Recoupling losses may alternately be avoided by configuring the hologram to launch optical radiation into the highly transparent plate at a small trapping angle, defined above as less than about 5 degrees. This reduces the number of subsequent interactions with the holographic film and reduces the optical losses.

A. Holographic medium

The holographic medium can be of any known material type capable of forming a volume phase hologram. Several of the existing film material types include duPont's Omnidex photopolymer film, Polaroid's Mirage photopolymer material, dichromated gelatin, polyvinyl carbozole-based photopolymer films, silver halide emulsions and any other holographic materials.

In addition, these films can be layered, with each layer having different angular, spectral and spatial multiplexed properties. This can take the form of two or more layers of holographic film attached to the highly transparent plate. Each additional layer must be index-matched in order to keep interfacial reflection from trapping light in the thin film layers which are more absorbing than the highly transparent plate.

The commercial holographic materials available from duPont and Polaroid have existing chemistries and processes which allow for the formation of nonuniform fringe structures; dichromated gelatin films also have the existing chemistry to form nonuniform fringe structures. (Nonuniform fringe structures are structures which have a variation in fringe spacing from the front to the back of the film.) In addition to these techniques, holographic structures can also be shrunk or swelled utilizing optical adhesives. This can be utilized when creating multilayer stacks of holographic film, bonding the holographic film to the highly transparent plate or providing a protective layer for the holographic film.

The HPC of the present invention relies on the combined techniques of angular, spatial and spectral multiplexing to accomplish its function, which is to concentrate light. By combining these techniques, the production of a unique MHOS is achieved.

1. Optical Losses

The HPC of the present invention requires that the holographic structure be spatially multiplexed to avoid recoupling in order for the device to function. This is completely different from the way waveguide couplers work in waveguiding applications. The holographic waveguide couplers used in the coummunications industry do not have to address subsequent passes through the holographic structure once the light is diffracted into the waveguide. Overcoming the recoupling losses in the HPC is the primary reason for the complexity of the spatial multiplexing which embodies both the angular and spectral multiplexing in order to achieve the spatial multiplexing.

To reduce light losses in the structure, novel techniques are used to prevent loss of optical energy. The highly transparent plate can be chosen to be any thickness, but for practical purposes, it will typically be in the thickness range of 1 to 15 mm. Thicker highly transparent plates begin to become very costly and are not practical for the applications disclosed herein. Given these limitations to plate thickness and the goal of having the light advance through the HPC structure with as few bounces as possible, it is required that the internal diffracted wave vector angle be sufficiently small so that the light is diffracted more directly down the HPC structure. HPC structures with a pathlength-to-thickness ratio (PTR) between 25 and 200 are preferred. Pathlength is the greatest distance the light collected by the HPC has to travel in the HPC structure to reach the receiver location.

To make the HPC of the present invention work for the above pathlength to thickness ratios, many factors have to be taken into account. The following is a list of the techniques used in the HPC to reduce optical losses:

1. Absorption of the light energy in the HPC structure comes from three sources. The first is the absorption in the highly transparent plate. The material from which the highly transparent plate is made of is chosen to have low absorption in the spectral region from 350 to 1400 nm. By "low absorption" is meant an absorption less than 10% (the inverse of highly transparent, defined above). The second source of absorption is from the film layer, so it is important to keep the film layers as thin as possible and as transparent as possible. As used herein, the term "thin" with respect to the film layer means a thickness of less than 30 $\mu$m, while the term "transparent" with respect to the film layer means an internal transmission of at least 90%. All of the films discussed herein are of sufficiently low absorption. The third source of absorption is the optical adhesive if one is used. Optical adhesives are available with very low absorption; such low absorption optical adhesives are preferred in the practice of the invention.

2. In order for the HPCs with the above PTR to collect light energy, the internal diffracted wave vector must be in the range of 1 to 40 degrees. A single grating will diffract a large bandwidth of light, with each wavelength in the spectral bandwidth diffracted with a different wave vector angle. This means that for a single grating, the chromatic angular spread can be larger than desired. The large spectral bandwidth for a single grating means that the light that is collected has a chromatic angular spread. An example of this is that a single grating with a 100 nm bandwidth represents an angular fanout of the collected light through a 30 degree angle. So as the bandwidth of the device is increased, a single grating structure would be self-limiting, as the light from the spectral bandwidth would start to be lost because the internal diffracted wave vector would exceed the TIR confinement of the highly transparent plate. This means that by increasing bandwidth in the HPC device, it is necessary to multiplex the spectral component while keeping the angular component within the TIR trapping of the HPC. This can be accomplished by keeping the grating angle constant and varying the grating spacing in the multiplexed recordings. This is one technique to increase bandwidth and maintain the required internal diffracted wave vector within the TIR confinement of the HPC. This angular spread can be reduced by spectral multiplexing of the single film, keeping the fringe angle fixed for each multiplexed recording. Since index modulation is shared between exposures, the amount of energy that is collected is approximately the same and the net result is that more wavelengths of light can be collected and diffracted into a narrower angular range. This means that more energy will be concentrated to the receiver.

3. The HPC device of the present invention requires the combination of a highly transparent plate with a holographic film that has a good refractive index match to the highly transparent plate. A close refractive index match is required between the highly transparent plate and film in order to effectively diffract into the highly transparent plate without having large Fresnel reflection at the highly transparent plate/film interface. If the mismatch in refractive indices causes a large amount of energy to be reflected at the interface, then the energy will be confined in the film which has a significantly larger absorption coefficient than the highly transparent plate. To effectively move light energy from the film into the highly transparent plate the refractive index of the film and highly transparent plate have to be very close, within 3% of each other. This will minimize the light traveling more distance in the film. The film absorption is typically higher than the highly transparent plate's absorption, so the preferred embodiment of the device uses a close match in refractive index to minimize the thickness of film that the diffracted light has to pass through.

4. The recoupling of the internal diffracted light through subsequent interactions with the holographic film as the light bounces through the HPC structure is the largest optical loss to overcome. This, however, can be reduced or avoided altogether by spatially multiplexing the holographic film portion of the HPC structure. The spatial multiplexing is performed by laying out a pattern of holographic optical elements (HOEs) that each have slightly different spectral and/or angular performance. The diffracted light of each spatially multiplexed region has different internal diffracted wave vector angles and a different spectral bandwidth related to those angles. HOEs have a direct link between angle and wavelength, so it is truly the combination of the two that determine if the spatially multiplexed regions are all discrete in terms of their performance. This discrete behavior means that light coming from one region will not be diffracted by the HOEs in the subsequent regions. The size of the multiplexed regions is a function of the pathlength-to-thickness ratio, since the number of bounces of light determines the number of required discrete spatially multiplexed regions. Again, the number of bounces is determined by the pathlength-to-thickness ratio and the internal diffracted wave vector.

B. Highly Transparent Plate

The highly transparent plate of the HPC can be made from glass or polymer that is optically transparent. The term "highly transparent" is defined above; by optically transparent is meant that the glass or polymer plate is transparent as defined herein at least in the wavelength region of about 350 to 1400 nm. The highly transparent plate can be any thickness or size. The preferred material for the highly transparent plate is low iron float glass that is chemically enhanced to increase solar transmission. Preferred glass types include Solarphire glass and Starfire glass, both available from PPG Industries, Inc. These glasses have internal transmittances of approximately 98%.

The highly transparent plate can have a flat or curved surface. Preferred dimensions will be dictated by application and size. One preferred embodiment utilizes low iron glass that is 6 mm thick. In addition, it is important that the refractive index of the holographic film and the highly transparent plate be closely matched, preferably, to a refractive index difference of at most about 3%, and more preferably less than this value. The close matching allows for steep coupling angles inside the highly transparent plate.

In some cases, it is desired that the refractive index of the film be slightly larger than the refractive index of the highly transparent plate, since there is a slight advantage to having the refractive index of the film being slightly larger than that of the glass if there is a mismatch. The advantage manifests itself as a reduction in the Fresnel reflection losses at the interface, hence improving coupling efficiency compared with the highly transparent plate having a larger refractive index than the film. However, this should not be construed as a limiting factor to the claims set forth herein, since the device will still work when implemented in either mode.

In choosing the highly transparent plate and film refractive indices, there are a number of important parameters required for the HPC device to work effectively. The nature of the HPC device lends itself to many applications and hence many variations in the embodiment of the device. It is the intent and scope of this patent to include all variations of the holographic structure described herein.

FIG. 1 depicts an example of the basic embodiment of the present invention, in which the holographic planar concentrator 10 is shown comprising highly transparent plate 12 and holographic film 14. The holographic film 14 is mounted on the side 12a of the highly transparent plate 12 opposite that side 12b on which solar energy is incident.

Careful selection of the refractive indices of the highly transparent plate and the holographic film can allow for coupling of light into the highly transparent plate at very steep angles as is shown in FIG. 1. The light, represented by rays 16, 16', 16", is seen as entering at an angle $\theta_{in}$ and being coupled into the highly transparent plate 12 at an angle $\theta_{out}$ as rays 18, 18' 18", respectively. The particular diffraction grating recorded, described in greater detail below, in the holographic film 14 controls the angle $\theta_{out}$. As will be shown below, a wide acceptance angle $\theta_{in}$ can be coupled into the highly transparent plate 12 as a smaller angle $\theta_{out}$.

Figure 2:
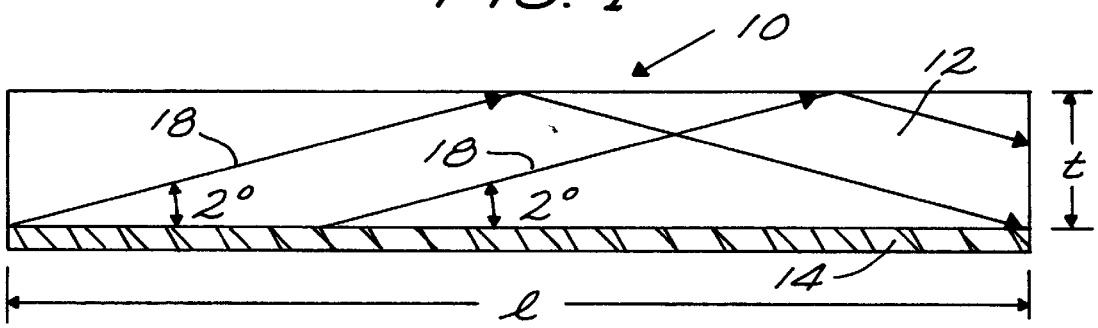
FIG. 2 is a cross-sectional view and illustrates an example of a steep angle embodiment of the holographic planar concentrator of the present invention.

An example of the foregoing is depicted in FIG. 2, in which the refractive index of the holographic film 14 is chosen to be 0.001 greater than the refractive index of the highly transparent plate 12. This means that use of a 6 millimeter thick (t) highly transparent plate 12 and a trapping angle of 2 degrees results in an optical path length (l) of 343 millimeters before the coupled light 18 will strike the holographic film 14 for a second time; this combination provides a PTR of 57.2. This illustrates one technique of avoiding recoupling losses in the HPC device 10. It is understood that glass thickness and trapping angle affect the effective size of the devices. The optical path lengths discussed here allow for many practical applications of the HPC technology.

Figure 3:
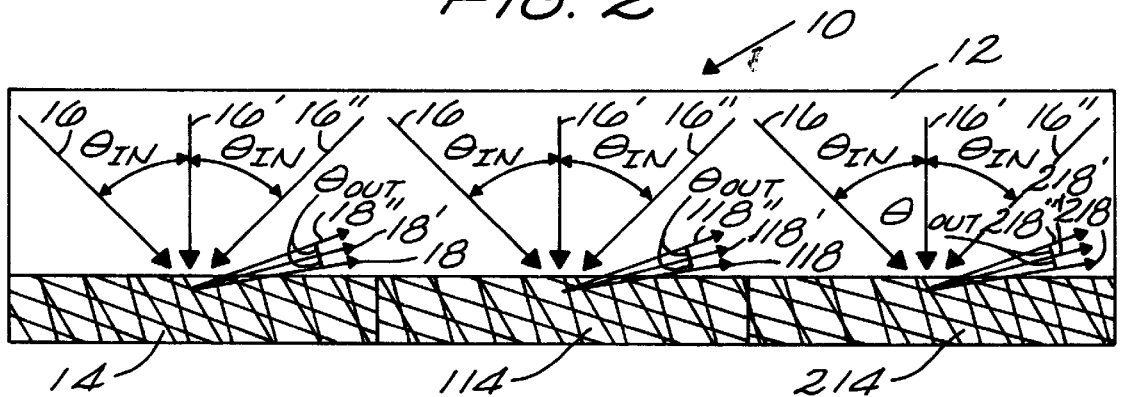
FIG. 3 is a cross-sectional view illustrating an angularly and spatially multiplexed holographic optical structure showing angular spread of input and output rays.

In another embodiment of the present invention, the trapping angles are not limited to small angles but rather a combination of angles are used in a spatially multiplexed approach, as is shown in FIG. 3. As indicated above, the phrase "small trapping angle" refers to an angle of less than about 5 degrees.

The holographic film comprises a plurality of regions, denoted 14, 114, 214, incident on each of which are rays 16, 16', 16", as described above. Each region 14, 114, 214 has a different diffraction grating, resulting in a set of angles $\theta_{out}$ of light coupled into the highly transparent plate 12 that can either be identical to each other or different; however, the angle that the middle ray 18', 118', 218' of the set makes to the plane defined by the holographic film 14 is different in each case.

This spatial multiplexing technique allows for multiple reflections from the holographic structure and hence larger trapping angles can be used. This approach reduces the need for a close index match between the highly transparent plate and the holographic film. As an example, in a case using very steep trapping angles, a very good match between the refractive index differs by only 0.01% but for a spatial multiplexed case, the refractive index may vary by up to 3.0% for a worst match scenario.

Spatially multiplexing the multiplexed holographic optical structure (MHOS) can produce HPC devices with functionally longer optical path lengths, thus increasing the functional size of the HPC panels and increasing the number of applications that the HPC can be used for. Spatially multiplexing the HPC holographic structure will also avoid the limiting factor of beam degeneracy when angularly multiplexing and concentrating the gathered light. Beam degeneracy can also be avoided by utilizing the HPC device in a line focusing mode instead of a point focusing mode.

Material dispersion effects of the mismatch between the refractive indices of the holographic film and the highly transparent plate can be minimized by designing the HPC device to perform at a wavelength where the refractive index of the glass matches that of the holographic film. The differing normal material dispersion will then cause a divergence of the refractive indices of the glass and the film at other wavelengths differing from the design wavelength. The effect of dispersion on the overall match of the refractive indices between the film and the glass is that the index match really represents an average match over the chosen spectral range.

C. Holographic Recording Process

The HPC of the present invention is fabricated by attaching a holographic film or films to one side of an optical highly transparent plate. The holographic film is attached to the side opposite of the incoming light. Recording of the master MHOS is performed in an index matched environment; these techniques are known by those skilled in this art. By "indexed matched environment" is meant that an appropriate material which is very transparent at the recording laser wavelength and matched in refractive index to the film is used in such a geometry to allow propagation of the laser beam into the film at very steep angles. There have been many ways to bring laser beams into materials at steep angles and all require index matching. Different techniques utilize glass blocks, prisms and fluids in tanks. This technique is required for making the master hologram, but once the master is made, it only requires index matching the film to be copied to the master plate. The replication also requires that the recording be done in an index matched environment between master and copy, but it is a simpler process for mass production.

Figure 4:
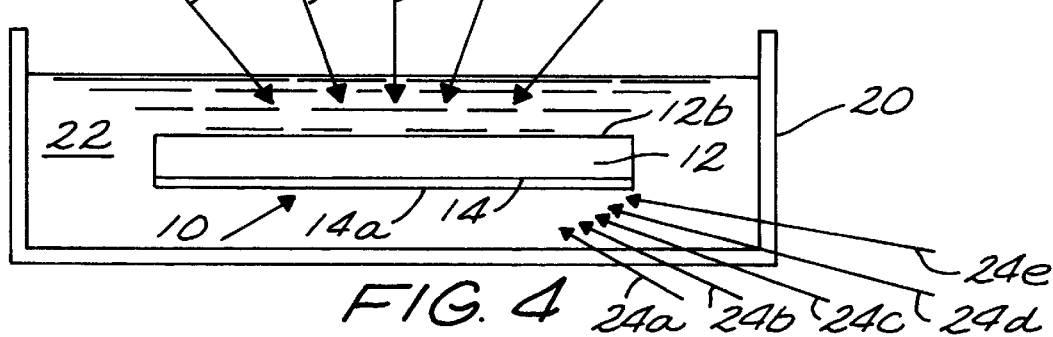
FIG. 4 is a schematic diagram of an angularly multiplexed single wavelength recording setup used for fabricating the holographic planar concentrator (HPC) of the present invention.

One embodiment can use a liquid gate or a tank filled with index matching fluid in which the hologram and attached highly transparent plate are placed for exposure, as illustrated in FIG. 4. The refractive index matching fluid in the tank should be within about 12% of the refractive index of the holographic film and the highly transparent plate. Preferably, a liquid with a refractive index slightly larger than the film and the highly transparent plate is employed. The better the match between the liquid and the highly transparent plate/film, the fewer noise gratings will be formed.

FIG. 4 shows the HPC 10 comprising the highly transparent plate 12 and holographic film 14 immersed in a tank 20 filled with a fluid 22 having substantially the same refractive index as the highly transparent plate 12. Object beams 22a–22e are incident on the top surface 12b of the highly transparent plate 12, while reference beams 24a–24e are incident on the exposed surface 14a of the holographic film 14. The letters represent recording pair designation. The object beams 22a–22e and the reference beams 24a–24e are generated by techniques well-known in the art of holographic recording and do not form a part of this invention.

The index matching tank provides an environment which reduces the amount of stray light scattered from interfaces and other surfaces. This enhances the quality of the MHOS by minimizing the amount of optical noise in the recording process.

Multiple laser beams are used to record a unique holographic structure which will accept light from a range of input angles and direct the light down the optical highly transparent plate. Once in the optical highly transparent plate, the light is trapped so long as the light does not encounter any subsequent interactions with the same holographic structure. The recording process is a combination of angular, spectral and spatial multiplexing and can be performed in many ways by those skilled in the art.

Figure 5:
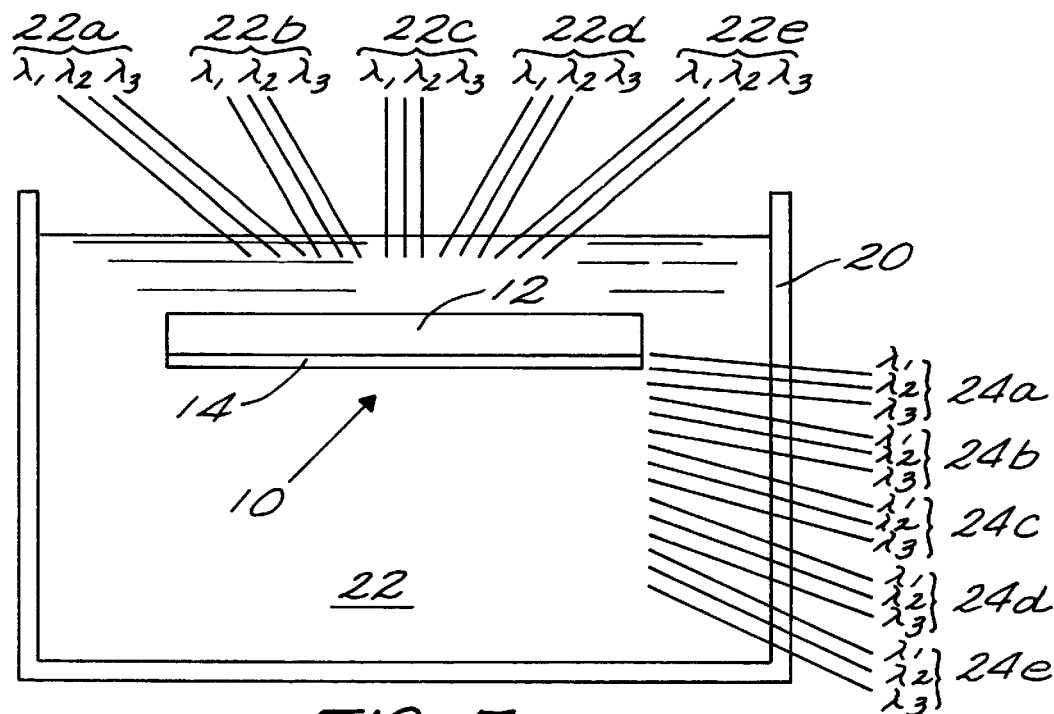
FIG. 5 is a schematic diagram of an angularly multiplexed multi-wavelength recording setup used for fabricating the holographic planar concentrator of the present invention.

Multiple pairs of laser beams are used with varying angles and different wavelengths and can have collimated, diverging, converging or a combination of wavefronts when fabricating the HPC, as shown in FIG. 5. Each pair of recording wavefronts has one object beam which mimics one narrow range of sun angles during the day and one reference beam which mimics the desired playback (concentrated) wavefront. There is no one preferred embodiment for the recording geometry, since the desired playback location varies for a given application or position. Because the mounting orientation of the HPC and its installed location on the Earth will vary, the HPC has the advantage of being recorded for different input angular ranges and different spectral collection requirements. To give an example, the HPC can be mounted vertically or tilted to the desired latitude of placement. In addition, the range of input angles may be chosen to be very narrow or very large, depending on the type of illumination available and the desired output spectrum.

The beam recording geometries vary with the grating design. The input angle range for, say, one multiplexed film recorded at 676 nm and 514 nm laser wavelengths will be plus or minus 35 degrees from the normal in the medium and 100 to 140 degrees from the normal in the medium. Beam pairs are selected from this range of angles for producing the desired holographic structure to capture and concentrate the desired solar energy for the given location and mounting orientation. One preferred embodiment uses two recording pairs with angles of 30 and 100 degrees for one pair and –30 and 130 degrees for another pair.

While the HPC can be used in either passive or active tracking modes, the use of angular multiplexing permits the use of passive tracking, which simplifies the overall structure and reduces cost. As an example of a preferred passive tracking embodiment, the HPC photovoltaic panel is mounted tilted to the latitude of installation and has the center angle of acceptance normal to the HPC front surface. The angular recording then mimics a variation of as much as approximately 160 degrees in the daily sun angle and 45 degrees in the seasonal sun angle. This represents a multitude of recording pairs, each launching their object beams at approximately 10 degree intervals.

As indicated above, the hologram that is recorded includes angular and spectral multiplexing. Spatial multiplexing is achieved by defining different regions in the holographic film, as described in greater detail below, and using the process depicted in FIG. 5 to record the angular and spectral multiplexing in each region. Light coupled into the highly transparent plate 12 in one spatial region thus does not interact with the holographic film 14 in another spatial region. The use of the combination of regions essentially avoids recoupling losses resulting from multiple interactions of the holographic film by the light confined in the highly transparent plate. This spatial multiplexing approach results in higher efficiency and the ability to create larger HPC devices.

The MHOS can be recorded with gaussian or nongaussian beam profiles. The use of different beam profiles allow for control of the exposure intensity across the holographic film. This translates into control over the diffraction efficiency of the final MHOS. Intensity of the laser energy across the holographic film is important in controlling the playback efficiency of the MHOS, since the quality of the holographic recording is determined in part by the intensity of the exposure energy striking the holographic film. The intensity of the recording energy across the film should be substantially uniform, by which is meant a variation in intensity of not more than about ±10 percent. Different holographic film materials require different exposure conditions and are more sensitive to exposure intensity. The uniformity of not more than about ±10 percent is a guideline to successfully fabricating HPC devices and is not necessarily the ideal exposure uniformity for every type of holographic film material.

The HPC 10 can also be fabricated using more than one layer of holographic film. By utilizing diffractive holographic structures, multiple layers can be used. Essentially, blue photons only interact with the MHOS sensitized to the blue portion of the solar spectrum and the red photons only interact with the film sensitized to the red part of the solar spectrum.

Holographic reflective structures have the ability to be fabricated in a range of spectral performance from very narrow (a few nanometers) to very broad (several hundred nanometers). This allows for the tailoring of the reflective holographic film with a spectral bandwidth of chosen size within these bounds.

D. Multiplexed Holographic Optical Structure

1. Angular multiplexing

The HPC of the present invention uses angular multiplexing to achieve a multitude of reflection type volume phase holograms in a single film. Many techniques exist for angularly multiplexing and are known to those skilled in the art. The preferred embodiment utilizes collimated and diverging recording wavefronts, although converging wavefronts may also be used. The wavefronts are directed from opposite sides of the holographic film to produce a reflection-type volume phase holographic structure, as shown in FIGS. 4 and 5. In addition, the polarization of the wavefronts can be chosen to achieve a maximum fringe contrast.

The MHOS can be created utilizing several different wavelengths of laser light or a single wavelength with the recording angles adjusted to play back at the desired wavelengths. Single wavelength recording can be used to simulate multispectral recording by adjusting recording angles of the multiplexed reference and object beams such that a recording beam at one angle is designed to playback at a different angle and different wavelength. This is due to the relationship between angle and wavelength in diffractive structures. In addition, more than one holographic film can be used if required and applied over the first holographic film. The additional films can be used for increasing angular performance or broadening the spectral bandwidth of the HPC.

Angularly multiplexing a single wavelength can result in an angular performance at the recording wavelength but also at other wavelengths with a different angular performance. The net effect is a single wavelength recording with enhanced spectral characteristics.

2. Spectral Multiplexing

To increase the spectral bandwidth of the HPC devices, the spectral sensitivity of the MHOS can be enhanced using techniques known in the art. The holographic structure can be recorded with multiple laser wavelengths as well as multiple angular inputs. Recording with multiple wavelengths has the advantage of increasing the spectral sensitivity of the MHOS. In addition to recording with multiple wavelengths, it is also possible to nonlinearly shrink or swell the MHOS; this results in a series of fringes with varying spacing. The fringes with varying spacing has the effect of increasing the spectral bandwidth width of the HPC device.

3. Spatial Multiplexing

Figure 6:
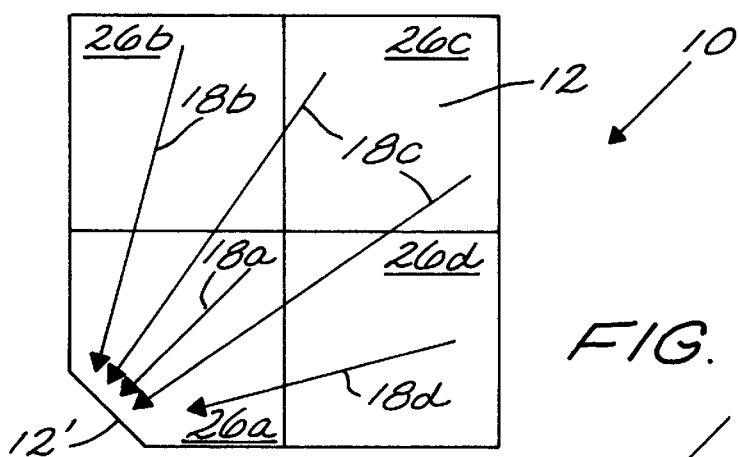
FIG. 6 is a top plan view illustrating an example of a spatially multiplexed HPC, showing regions with different grating vectors.

Each region of the MHOS has multiple gratings and a range of grating vectors. The different regions have grating vector ranges that differ substantially so that the light confined in the highly transparent plate is not recoupled out of the HPC when it strikes regions of the MHOS on its way to the edge 12' of the highly transparent plate 12, as shown in FIG. 6, which is a top plan view. FIG. 6 shows an example of a spatially multiplexed HPC 10, with each region 26a–26d with different grating vectors, resulting in coupled light 18a–18d incident on the edge 12' at different angles.

To avoid recoupling losses from subsequent reflections from the MHOS, a spatial multiplexing approach is used. In this embodiment of the HPC, the MHOS is divided into many different regions, with the regions in front of the advancing light having a different Bragg angle than the light striking that region as shown in FIG. 3. This technique prevents recoupling losses, since the subsequent reflections from the MHOS for light that is confined to the highly transparent plate strikes a holographic structure which has a substantially different grating vector than the spatial region from which the light was initially diffracted.

4. Additional Considerations

The combination of the highly transparent plate 12 and the holographic film 14 regions physically form the total light trapping structure 10. The reason that the spatial multiplexing is required in the MHOS is because the light 18 has to pass through the holographic film 14 and bounce off the air/film interface to continue to be confined in the structure 10 by TIR. The light 18 is required to remain in the total structure 10 in order to be delivered to the receiver 30, 32. The close refractive index match required to launch the light 16 into the glass or polymer highly transparent plate 12 ensures that the light bounces back through the film 14 to the film/air interface. The present invention requires a fairly large area and hence long pathlengths to be a good solar collector. This is discussed above with regard to the particular example in connection with FIG. 2, describing 6 mm thick glass with a pathlength of 343 mm. Any angle that is larger will be required to pass through the film 14 an additional one or more times. The spatial multiplexing allows for regions 14, 114, 214 to have different holographic performance and hence not interact with the advancing light from a previous holographic region.

E. Focusing

Figure 7:
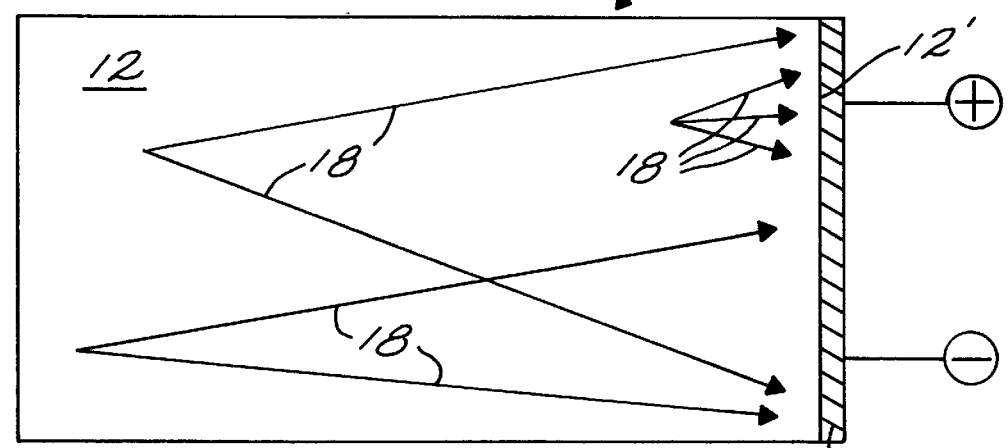
FIG. 7 is a top plan view illustrating a line focus HPC with photovoltaic (PV) cells attached to one edge.
Figure 8:
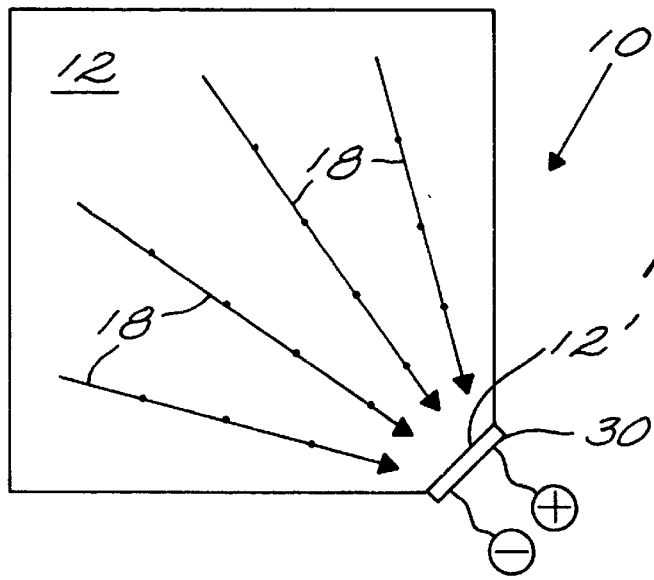
FIG. 8 is a top plan view illustrating a multiplexed focusing HPC-PV device.
Figure 9:
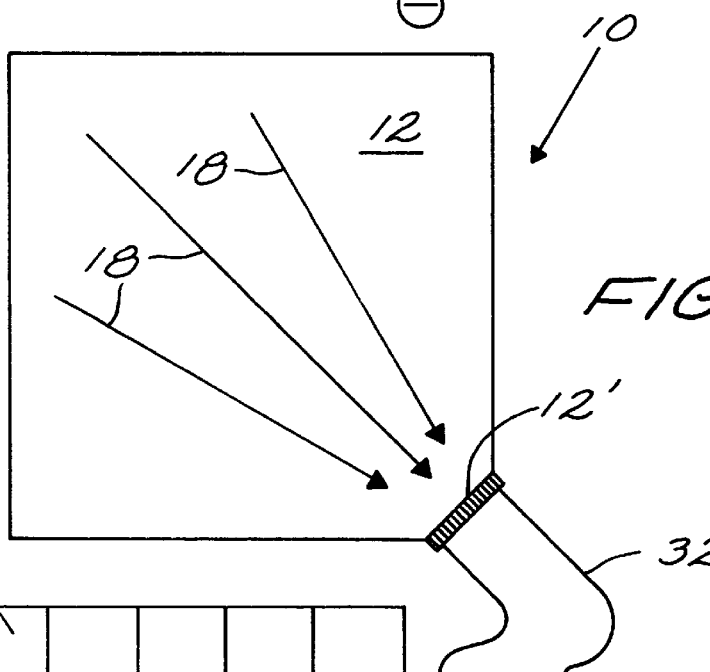
FIG. 9 is a top plan view illustrating a point focus HPC device with fiber optic lightguide.

The HPC can be designed to concentrate light in two dimensions, essentially a line focus (FIG. 7) or in three dimensions, essentially a point focus (FIGS. 8 and 9). In FIG. 7, the coupled rays 18 are incident on a photovoltaic cell 30 mounted along the edge 12' of the highly transparent plate 12. In FIGS. 8 and 9, the coupled rays 18 are focused onto a light-receiving device, such as the photovoltaic cell 30 (FIG. 8) or a fiber optic lightguide 32 (FIG. 9).

This ability to concentrate light in two or three dimensions gives the HPC of the present invention the ability to create a focal region which is a square or rectangular region of any size, depending on the thickness of the highly transparent plate and the amount of focusing incorporated into the holographic structure. The focusing can be accomplished with imaging or nonimaging techniques. The nonimaging technique produces a square or rectangular region due to the subsequent internal reflections in the highly transparent plate. The imaging technique can be used to produce focal regions of varying shapes such as circular or elliptical focal regions. The two techniques can also be combined to produce focal regions with the combined geometric properties of nonimaging and imaging focal regions. In addition to the overall shape of the focal region, the intensity distribution in the focal plane can be adjusted using either the imaging or nonimaging recording techniques. This allows for more design freedom in the utilization of the concentrated light.

Figure 10:
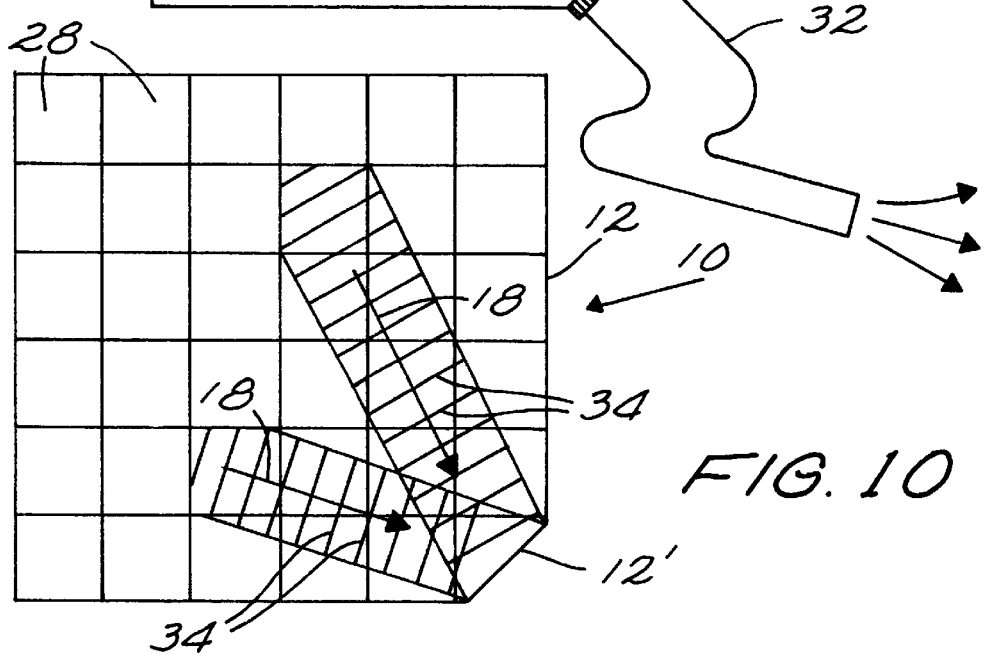
FIG. 10 is a top plan view illustrating a spatially multiplexed HPC device, depicting a nonimaging approach to concentrating light.

One embodiment utilizes the spatial multiplexing approach combined with collimated recording beams to produce a tiled holographic structure of regions 26 the same size as the focal region 12' (FIG. 10). The collimated playback beams 18 from each tile 26 of the holographic structure sum at the focal region 12' to produce a concentration of the incoming light. This technique allows for the design of HPC devices that can avoid recoupling losses by designing the layout of the holographic regions such that the location and grating vector of the region avoids the recoupling of light out of the waveguide 12. The lines 34 normal to the light propagation vector 18 represent a flat collimated wavefront.

F. Device Operation

The holographic planar concentrator of the present invention functions like a conventional two-stage concentrator that has been folded into the plane of the collecting device. Incoming light from a range of acceptance angles passes through the optical highly transparent plate and is reflected/diffracted by the multiplexed holographic structure trapping the light in the plate and guiding it to one edge of the plate or to a focal region on the edge of the plate. In addition, larger plates with several HPC holographic structures can be produced with multiple focal regions on different sides of the plate or focused into the corners of the plate. This basic scheme of operation can be used as the fundamental building block for many applications. When combined with a photovoltaic device or a fiber optic lightguide, the HPC of the present invention becomes an energy generating or energy redirecting product (FIGS. 7–9).

One of the primary advantages of the HPC device over conventional concentrators is its ability to gather light from a large range of input angles while being mounted in a stationary (non-tracking) configuration. To achieve this ability, the HPC device utilizes a multiplexed holographic structure along with the TIR trapping of the highly transparent plate. This two-stage concentrator approach works similarly to some nonimaging optic concentrators which rely on TIR confinement of light. It is the combination of the unique multiplexed holographic structure and the TIR confinement which combine into the novel light concentrator of the present invention. The HPC has many advantages in terms of ease of fabrication and low material cost.

Further, the HPC can be used to collect either direct light from the sun or diffuse light, such as light on cloudy days or light reflected from the surrounding environment. The HPC is intended to collect substantially all of the solar spectrum, particularly in the range of about 350 to 1400 nm.

The four primary applications for the HPC products are (1) solar electric power generation, (2) daylighting with natural sunlight, (3) thermal heating, and (4) windows which combine any or all of the three previous applications along with, optionally, the filtering of ultraviolet and infrared energy from sunlight. The four primary application are described below.

1. HPC-Photovoltaic Panel

The first device utilizes a photovoltaic cell to convert the concentrated light to electricity. FIGS. 7 and 8 depict this embodiment. Any number of different photovoltaic conversion devices can be used and the output spectrum of the HPC can be engineered to more closely matched the bandgap of the conversion device to reduce the cooling required on the photovoltaic cell.

The HPC photovoltaic (PV) panel utilizes the HPC with a PV cell to convert the light gathered by the HPC into electricity. The PV cell is directly bonded to the edge of the highly transparent plate, as shown in FIG. 7, creating an integrated PV panel. One embodiment (FIG. 7) has the entire edge 12' of the HPC 10 covered with one or more PV cells 30. Other embodiments utilize a point focus HPC device 10 and a PV cell 30 mounted on the corner or side 12' of the highly transparent plate 12, such as shown in FIG. 8). The advantages of the HPC-PV panel include the following:

1. Passive tracking concentrator.
2. Two-stage light trapping.
3. Multiple panel embodiments, flexible in design.
4. Selective bandwidth capability to minimize waste heat, design feature.
5. Transparent HPC allows for additional films or collection devices behind the PV panel, hence minimizing costs associated with structural requirements and land requirements.
6. Monolithic PV arrays mounted at focal point.
7. Utilization of series-connected cells possible due to uniform illumination at collection area; this is a result of the nonimaging behavior of the HPC concentrator.

2. HPC-Skylight

In another application of the HPC technology, a fiber optic cable 32 is bonded to the edge of the HPC at the focal point of the concentrated light, as shown in FIG. 9. The light 18 is launched directly into the fiber optic lightguide 32. Other embodiments can include additional optics to improve the coupling efficiency between the HPC and the lightguide. The advantages of the HPC-skylight include:

1. Passive tracking concentrator.
2. Collection and launching of light into a fiber optic lightguide.
3. Selective bandwidth to launch only the desired light into the fiber optic for illumination purposes.

3. HPC-Hot Water Heater

Figures 11, 12:
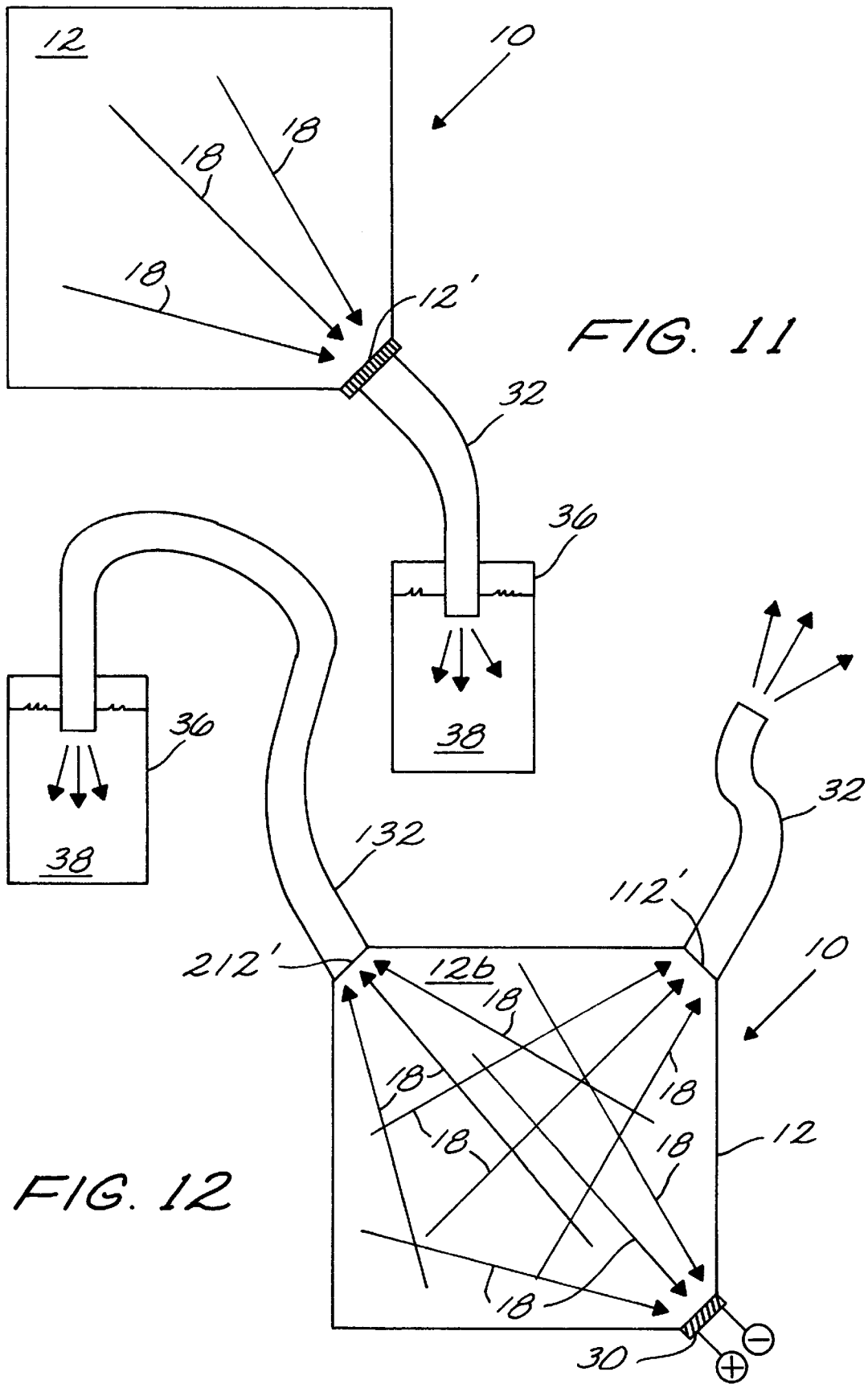
FIG. 11 is an illustration of an HPC-solar hot water heater.
FIG. 12 is an illustration of an HPC-window, illustrating one possible distribution of solar spectral energy.

A variation on the HPC-Skylight embodiment uses the light concentrated into the fiber optic lightguide to heat water for domestic hot water applications. This embodiment is depicted in FIG. 11, which shows the fiber optic lightguide 32 secured to the edge 12' of the highly transparent plate 12. Solar energy 18 is thus guided into a conventional hot water tank 36 filled with water 38. The solar spectrum is confined and absorbed within the hot water tank, thereby either heating the water directly (wavelengths absorbed by water molecules) or indirectly (wavelengths absorbed by hot water tank liner and re-radiated into the water). The advantages of the HPC-hot water heater include:

1. Passive tracking concentrator.
2. Collection and launching of light into a fiber optic lightguide.
3. Selective bandwidth to launch only the desired light into the fiber optic for heating water.

4. HPC-Window

The HPC window is yet another embodiment of the invention and combines the features of the other applications with the ability to filter ultraviolet and infrared light. FIG. 12 depicts one embodiment of the HPC window 10, with several edges, denoted here as 12', 112', and 212'. A photovoltaic cell 30 is attached to edge 12', and, if it is a silicon PV cell, absorbs radiation in the region of about 700 to 1100 nm. A first fiber optic lightguide 32 attached to edge 112' is used to guide visible light (in the region of about 400 to 700 nm) into the interior of a building (not shown) to the side of which the window 10 is attached, to provide a natural source of light. A second fiber optic lightguide 132, attached to edge 212', is used to guide primarily infrared energy in the region of about 700 to 1400 nm to a hot water tank 36 for heating the water 38 therein. Ultraviolet light (not shown) in the region of about 350 to 400 nm incident on the front surface 12b of the window 10 is blocked from passing through the window by the particular structure of the holographic film 14 (not shown in FIG. 12), attached to the back surface of the window; a suitable holographic grating and/or a UV-blocking component in the holographic film could be used, for example.

The HPC window 10 shown in FIG. 12 is merely exemplary, and it will be appreciated by those skilled in this art that other devices and other combinations thereof may be employed to utilize various portions of the solar spectrum and/or block undesired portions thereof from passing through the window 10. The advantages of the HPC-window include:

1. Control of solar gain through the window.
2. Control of ultraviolet and infrared energy transmission.
3. Passive tracking concentrator.
4. Collection and launching of light into a lightguide.
5. Generation of electricity with photovoltaic devices.
6. Collection of energy for heating applications possible.
7. Selective spectral and angular bandwidths.

Figure 13:
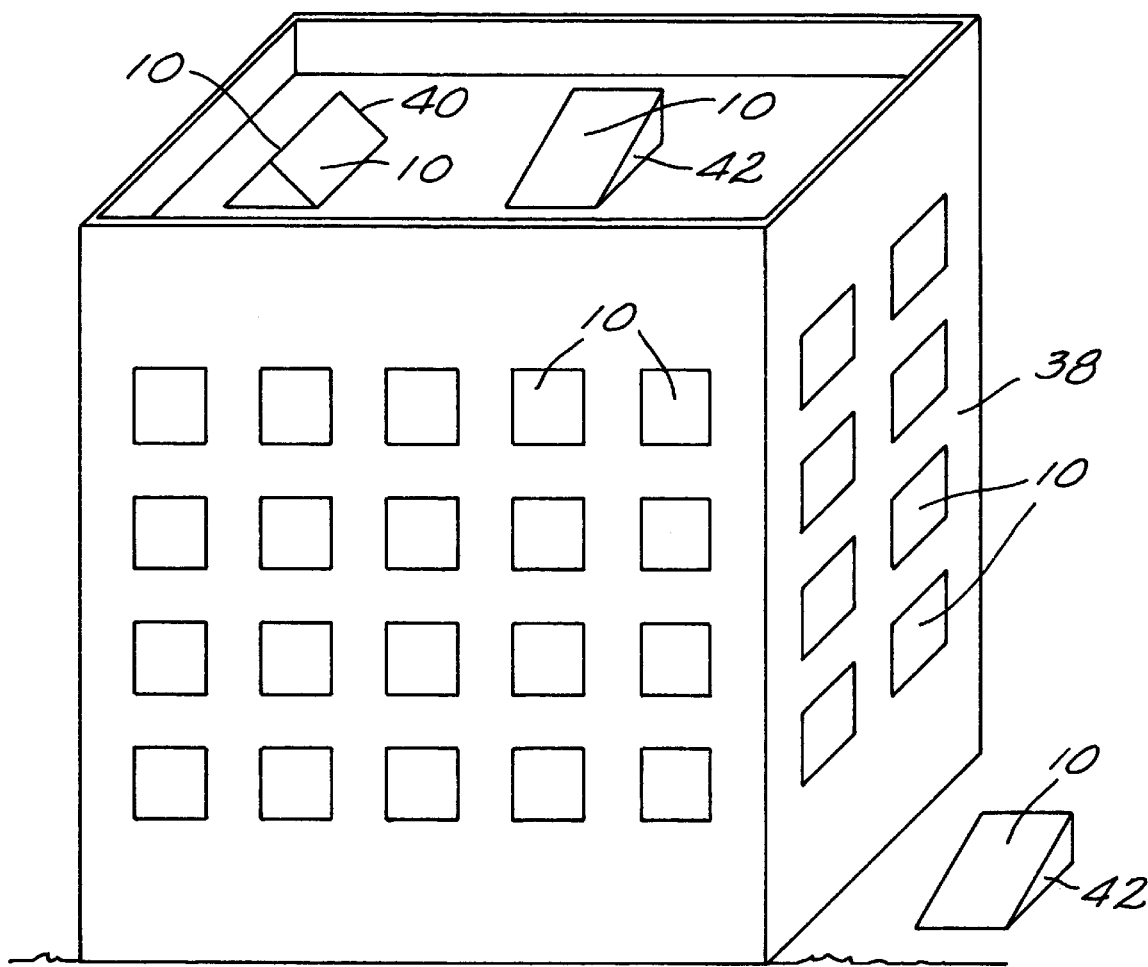
FIG. 13 is a view of a building incorporating a plurality of HPC-windows of the present invention.

FIG. 13 depicts a building 38 employing a plurality of HPC windows 10, used with one or more of the devices described above. Further, skylights 40 or separate solar panels 42 comprising the HPC window 10, either roof-mounted or, in the case of solar panels, ground-supported, may be utilized. The solar panels 42 may use either totally passive tracking or active tracking mechanisms, which are well-known in the art and thus not shown here. The HPC windows 10 may be employed on the east, south, and west sides of the building 38 for collection of both direct and indirect solar radiation and on the north side of the building (in the northern hemisphere) or on the south side of the building (in the southern hemisphere) for collection of indirect solar radiation.

EXAMPLES

Devices comprising a multiplexed (angular and spectral) holographic film bonded to a glass plate have been fabricated with large angular acceptance. One experiment utilized three angular and three spectral multiplexed beams with a calculated light gathering efficiency of 20 percent. The angular performance of the devices was 160 degrees in the daily solar angular variation and 45 degrees in the seasonal angular variation.

In addition, larger spatially-multiplexed devices were made that utilized different holographic structures to reduce recoupling losses. The devices concentrated light to one edge of the glass plate. The spatially-multiplexed holographic structure varied from the region of the plate farthest from the edge that the light was concentrated to the region of the plate adjacent the edge that the light was concentrated to.

The largest device constructed to date is a 12 by 8.5 inch highly transparent acrylic plate, 6 mm thick with an active area of 8 by 8 inches (64 square inches). It utilized 3 layers of DuPont holographic film each layer representing a different spectral range (spectral multiplexing). The films were adhered with Norland NOA 65 optical adhesive. Each layer of holographic film had 44 different spatially multiplexed regions and each film was recorded using four multiplexed angular beams. Each spatial region was 50 mm by 15 mm. The regions varied from the output edge of the device linearly to the opposite edge of the HPC. The device showed a total solar collection efficiency of 2 percent at the optimum angle and calculated efficiency of 20 percent in the narrow wavelength band that it was recorded in 490 to 530 nanometers. It was constructed as a line focus HPC device.

Another example of a preferred embodiment utilized a piece of 4×12 inch, 6 mm thick, low iron Solarphire glass with 2 layers of Dupont Omnidex holographic film adhered to the glass with Norland NOA 65 optical adhesive. In the two layers of holographic film were multiplexed a total of 6 regions. These regions were angularly, spectrally, and spatially multiplexed. One film contained regions spatially multiplexed recorded at 500 nm, 568 nm, and 676 nm all with fringe angles of 37 degrees. The second film layer contained regions recorded at 500 nm, 568 nm, and 676 nm with a fringe angle of 40 degrees. This device performed with a collection efficiency of 13% total solar and 90% efficient in the desired collection bandwidth.

While the above description contains many specific details, these should not be construed as limitations on the scope of the invention, but rather as an exemplification of one preferred embodiment thereof. Many other variations are possible. For example, a single holographic film sensitized for full color recording will allow spectral multiplexing in one film and it can be angularly multiplexed with 32 recording beam pairs, one pair per 5 degree of daily solar sun angle variation. The film can then be nonuniformly swelled to increase spectral bandwidth. Another variation may use only a few angularly multiplexed beams to only gather light for a limited number of hours per day. This, too, can utilize full color recording film and nonuniform swelling. Accordingly, the scope of the invention should be determined not by the embodiment illustrated, but by the appended claims and their legal equivalents.

What is claimed is:

1. A holographic planar concentrator for collecting and concentrating optical radiation, said holographic planar concentrator comprising a planar highly transparent plate and at least one multiplexed holographic optical film mounted on a surface thereof to form a light guiding structure, said at least one multiplexed holographic optical film having recorded therein a plurality of diffractive structures having two or more regions which are angularly and spectrally multiplexed, said multiplexed hologram adapted to couple said optical radiation into said planar highly transparent plate such that said optical radiation is not lost and travels through both said planar highly transparent plate and said multiplexed holographic optical film, said multiplexed holographic film being multiplexed to reduce recoupling losses in said holographic planar concentrator.

2. The holographic planar concentrator of claim 1 wherein recoupling losses are reduced by employing said film adapted to launch said optical radiation into said planar highly transparent plate at a small trapping angle.

3. The holographic planar concentrator of claim 1 wherein said highly transparent plate comprises either a glass panel or an optically-transparent polymer panel.

4. The holographic planar concentrator of claim 1 wherein said optical radiation is derived from solar radiation.

5. The holographic planar concentrator of claim 1 comprising one multiplexed holographic optical film mounted on said surface.

6. The holographic planar concentrator of claim 1 comprising at least two multiplexed holographic optical films, stacked one on top of another to form an assembly mounted on said surface.

7. The holographic planar concentrator of claim 1 further having secured thereto at least one solar-collecting device.

8. The holographic planar concentrator of claim 7 wherein said at least one solar-collecting device is selected from the group consisting of photovoltaic cells and fiber optic cables.

9. The holographic planar concentrator of claim 8 wherein said fiber optic cable conveys at least a portion of said optical radiation to a solar-receiving device.

10. The holographic planar concentrator of claim 9 wherein said solar-receiving device is a hot water tank.

11. The holographic planar concentrator of claim 9 wherein said solar-receiving device is adapted to provide illumination interior to a building.

12. The holographic planar concentrator of claim 1 wherein said holographic planar concentrator is secured in a fixed position to provide passive tracking of the sun.

13. The holographic planar concentrator of claim 1 wherein said holographic planar concentrator is secured on a tracker adapted to track the sun either daily or seasonally or both.

14. The holographic planar concentrator of claim 1 wherein said planar highly transparent plate has a first index of refraction and said holographic optical film has a second index of refraction, with the difference between said first and second indices of refraction being no more than about 3%.

15. A holographic planar concentrator for collecting and concentrating optical radiation, said holographic planar concentrator comprising a planar highly transparent plate and at least one multiplexed holographic optical film mounted on a surface thereof to form a waveguiding structure, said at least one multiplexed holographic optical film having recorded therein a plurality of diffractive structures having one or more regions which are angularly and spectrally multiplexed, said multiplexed hologram adapted to couple said optical radiation into said planar highly transparent plate at a small trapping angle such that said optical radiation travels through both said planar highly transparent plate and said multiplexed holographic optical film.

16. The holographic planar concentrator of claim 15 wherein recoupling losses are reduced by providing two or more of said regions which are differently angularly multiplexed as well as spatially multiplexed.

17. The holographic planar concentrator of claim 15 wherein said highly transparent plate comprises either a glass panel or a optically-transparent polymer panel.

18. The holographic planar concentrator of claim 15 wherein said optical radiation is derived from solar radiation.

19. The holographic planar concentrator of claim 15 comprising one multiplexed holographic optical film mounted on said surface.

20. The holographic planar concentrator of claim 15 comprising at least two multiplexed holographic optical films, stacked one on top of another to form an assembly mounted on said surface.

21. The holographic planar concentrator of claim 15 further having secured thereto at least one solar-collecting device.

22. The holographic planar concentrator of claim 21 wherein said at least one solar-collecting device is selected from the group consisting of photovoltaic cells and fiber optic cables.

23. The holographic planar concentrator of claim 22 wherein said fiber optic cable conveys at least a portion of said optical radiation to a solar-receiving device.

24. The holographic planar concentrator of claim 23 wherein said solar-receiving device is a hot water tank.

25. The holographic planar concentrator of claim 23 wherein said solar-receiving device is adapted to provide illumination interior to a building.

26. The holographic planar concentrator of claim 15 wherein said holographic planar concentrator is secured in a fixed position to provide passive tracking of the sun.

27. The holographic planar concentrator of claim 15 wherein said holographic planar concentrator is secured on a tracker adapted to track the sun either daily or seasonally or both.

28. The holographic planar concentrator of claim 15 wherein said planar highly transparent plate has a first index of refraction and said holographic optical film has a second index of refraction, with the difference between said first and second indices of refraction being no more than about 3%.

29. A method of fabricating a holographic planar concentrator comprising a highly transparent plate and at least one multiplexed holographic optical film mounted thereon to form a waveguiding structure, said at least one multiplexed holographic optical film having recorded therein a plurality of diffractive structures which are angularly and spectrally multiplexed, said method comprising:

(a) mounting a holographic optical film on one surface of said highly transparent plate; and (b) recording said plurality of diffractive structures in said holographic optical film employing angular and spectral multiplexing techniques to produce said multiplexed holographic optical film, said multiplexed holographic optical film adapted to couple optical radiation into said highly transparent plate.

30. The method of claim 29 wherein said recording is performed in an index-matched environment by:

(a) immersing said highly transparent plate on which said holographic optical film is mounted in a fluid medium having an index of refraction that is substantially the same as that of said highly transparent plate; and (b) directing a plurality of object beams on a surface of said highly transparent plate opposite to that surface on which said holographic optical film is mounted; and (c) directing a plurality of reference beams on said holographic optical film.

31. The method of claim 30 wherein said recording is performed so as (a) to enable said film to launch optical radiation into said planar highly transparent plate at a small trapping angle or (b) to provide two or more regions which are differently angularly multiplexed as well as spatially multiplexed or (c) both, thereby reducing recoupling losses from said planar highly transparent plate.

32. The method of claim 30 wherein said object and reference beams have a gaussian profile.

33. The method of claim 30 wherein said object and reference beams have a non-gaussian profile.

34. The method of claim 30 wherein said recording is performed using a substantially uniform energy across said holographic optical film.

35. The method of claim 30 wherein said recording is performed at multiple wavelengths.

36. The method of claim 30 wherein said recording is performed at a single wavelength with the recording angles adjusted to play back at the desired wavelengths.

37. The method of claim 30 wherein said recording is performed under conditions to mimic a variation of up to approximately 160 degrees in the daily sun angle and up to approximately 45 degrees in the seasonal sun angle.

38. The method of claim 30 wherein nonuniform fringe structures are formed in said holographic optical film.

39. The method of claim 30 wherein reflective structures are formed in said holographic optical film, said reflective structures providing said holographic optical film with a spectral bandwidth which is responsive to a spectral band ranging from a few nanometers in width to several hundred nanometers in width.

40. A method of using a holographic planar concentrator comprising a highly transparent plate and at least one multiplexed holographic optical film mounted thereon to form a waveguiding structure, said at least one multiplexed holographic optical film having recorded therein a plurality of diffractive structures which are angularly and spectrally multiplexed, said method comprising:

(a) recording said plurality of diffractive structures in said multiplexed holographic optical film employing angular and spectral multiplexing techniques, said recording tailored to the intended orientation of said holographic planar concentrator to solar energy, said multiplexed holographic optical film adapted to couple said solar energy into said highly transparent plate; and, in either order, (b) mounting said holographic planar concentrator in said intended orientation for collecting solar energy; and (c) mounting at least one solar energy-collecting device along at least one edge of said holographic planar concentrator.

41. The method of claim 40 wherein said recording is performed so as (a) to enable said film to launch optical radiation into said planar highly transparent plate at a small trapping angle or (b) to provide two or more regions which are differently angularly multiplexed as well as spatially multiplexed of (c) both, thereby reducing recoupling losses from said planar highly transparent plate.

42. The method of claim 40 wherein at least one solar energy-collecting device is selected from the group consisting of photovoltaic cells, fiber optic cables, and hot water tanks.

43. The method of claim 42 wherein said photovoltaic cells are used to generate electricity, wherein said fiber optic cables are used to conduct illumination to distant locations, and wherein water in said hot water tanks is heated.

44. The method of claim 40 wherein said highly transparent plate comprises sheet glass or an optically-transparent polymer and is mounted vertically on a side of a building as a window.

* * * * *